United States Patent [19]
Frye
[11] 3,852,678
[45] Dec. 3, 1974

[54] PUSH-PULL AMPLIFIER WITH CURRENT MIRRORS FOR DETERMINING THE QUIESCENT OPERATING POINT

[76] Inventor: George Joseph Frye, 12175 S.W. Douglas, Portland, Oreg. 97225

[22] Filed: May 7, 1973

[21] Appl. No.: 358,152

[52] U.S. Cl. ........................ 330/15, 330/13, 330/20, 330/22, 330/28
[51] Int. Cl. ........................ H03f 3/26
[58] Field of Search ............ 330/13, 15, 17, 18, 20, 330/28, 40, 22

[56] References Cited

UNITED STATES PATENTS

| | | | |
|---|---|---|---|
| 3,319,175 | 5/1967 | Kramer | 330/13 X |
| 3,559,086 | 1/1971 | Wyckoff | 330/15 |

OTHER PUBLICATIONS

Turner; R. J., "Diodes Eliminate Crossover Distortion in Video Amplifier," Electronics, p. 92, January, 1970.

*Primary Examiner*—Alfred E. Smith
*Assistant Examiner*—Lawrence J. Dahl
*Attorney, Agent, or Firm*—Adrian J. LaRue

[57] ABSTRACT

A push-pull transistor amplifier includes two complementary common emitter output transistors with collectors connected together from which an output terminal is provided. The bases of these transistors are driven by complementary amplifiers in the form of current mirrors for quiescent operating point determination and as grounded base amplifiers for input signal injection. This arrangement realizes significant improvements in performance for crossover distortion, stable zero signal characteristics, gain bandwidth product and minimum number of circuit components.

10 Claims, 2 Drawing Figures

PUSH-PULL AMPLIFIER WITH CURRENT MIRRORS FOR DETERMINING THE QUIESCENT OPERATING POINT

BACKGROUND OF THE INVENTION

This invention relates to electrical amplifier circuitry, and more particularly to a push-pull transistor amplifier configuration.

In class B amplifiers, attempts have been made to achieve predictable operation combined with virtual elimination of crossover distortion in the region where one output device switches off and the other picks up the load. These problems have proved especially difficult in transistorized amplifiers, mainly because of the very nonlinear transconductance characteristics of the devices coupled with their very large base to emitter voltage temperature coefficient.

SUMMARY OF THE INVENTION

This invention is directed to a push-pull transistor amplifier wherein an input is connected to commoned emitters of complementary transistors, the collectors of these complementary connected transistors are connected respectively to the bases of other complementary transistors which have their collectors connected together and an output connected thereto. These other complementary transistors are in common emitter mode. Further complementary transistors have their emitters connected in common to ground and their bases are connected to respective bases of the input transistors for operating these input transistors in grounded base mode. These further transistors are used as idling current set diodes.

An object of the present invention is to provide a push-pull transistor amplifier that realizes significant improvements in performance for crossover distortion.

Another object of the present invention is the provision of a push-pull transistor amplifier that enables stable zero signal characteristics to be attained.

A further object of this invention is to provide a push-pull transistor amplifier that has excellent gain bandwidth product.

An additional object of this invention is the provision of a push-pull transistor amplifier that operates at very small power supply potentials.

A still further object of this invention is to provide a push-pull transistor amplifier wherein variations in the power supply voltage do not appear in the output.

Still an additional object of the present invention is the provision of a push-pull transistor amplifier that requires a minimum of components for optimum operation.

Other objects and advantages of the invention will become apparent as the description of the invention proceeds, reference being had to the accompanying drawing in which a push-pull transistor amplifier is disclosed which illustrates the principles of the invention.

BRIEF DESCRIPTION OF THE INVENTION

FIG. 1 is a schematic of a push-pull transistor amplifier according to the invention; and FIG. 2 is a schematic of the circuit of FIG. 1 in the form of an operational amplifier.

DETAILED DESCRIPTION OF THE INVENTION

Figure 1:
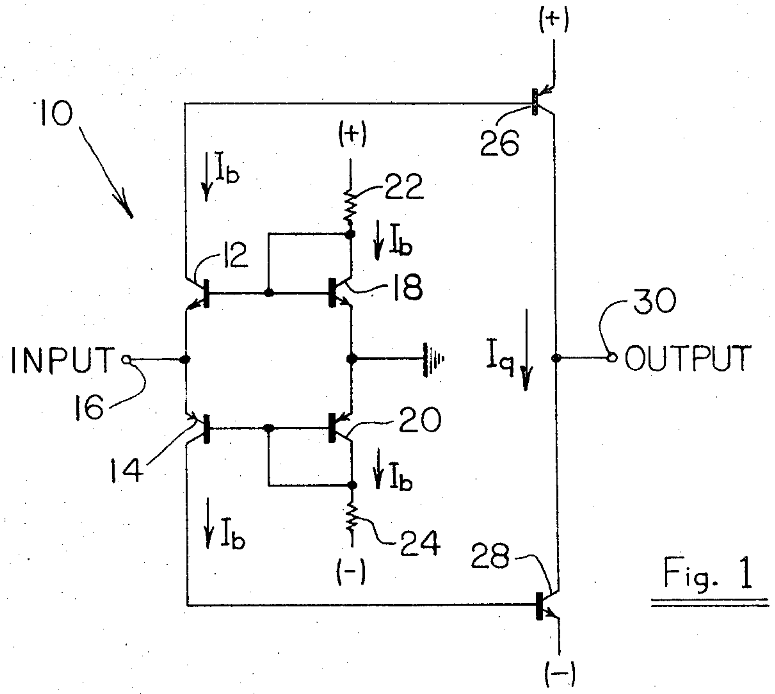

FIG. 1 is a schematic of a preferred embodiment of the invention. As shown therein, push-pull amplifier 10 comprises a pair of complementary transistors 12 and 14 each having base, emitter and collector electrodes. The emitter electrodes of transistors 12 and 14 are connected together and to input terminal 16. The bases of transistors 12 and 14 are connected to the respective bases of another pair of complementary transistors 18 and 20. The emitters of 18 and 20 are connected together and to ground. The collector of transistor 18 is connected to a positive potential through resistor 22 whereas the collector of transistor 20 is connected to a negative potential via resistor 24. The collector of transistor 18 is connected to the base thereof and the collector of transistor 20 is connected to its base so that transistors 18 and 20 are used as idling current set diodes. Transistors 12 and 14 are operated in the grounded base mode.

The collectors of transistors 12 and 14 are connected to respective bases of a further pair of complementary transistors 26 and 28. The collectors of transistors 26 and 28 are connected together and to output terminal 30 while the emitters are connected respectively to a postive and negative potential. Transistors 26 and 28 are in common emitter mode.

The operation of the circuit is as follows: With zero input voltage, current $I_q$ (quiescent) is set by $I_b$ times beta, where $I_b$ is the output transistors 26 and 28 base current and beta is their current gain. $I_b$, in turn, is set by the current mirror pairs formed by transistors 12 and 18 and transistors 14 and 20. Under ideal circumstances, the following pairs of transistors should be matched: transistors 12 and 18, transistors 14 and 20 and transistors 26 and 28.

Positive and negative power voltages have equal values. The value of $I_q$ set in this manner is quite stable with temperature as the beta of transistors is not significantly dependent upon temperature variations.

As can be discerned, the arrangement of input transistors 12 and 14 shows them to be operating in the common base mode for signal inputs. The input impedance is very low and because transistors are basically current amplifiers, this low impedance is actually an advantage for almost all circuits applications.

A positive going signal current at input terminal 16 tends to turn off transistor 12 and biases transistor 14 on. With practically all the input current flowing to the base of output transistor 28 via the collector of grounded base transistor amplifier 14, output terminal 30 thereby receives beta times signal current from the collector of transistor 28.

The same operation takes place for a negative going signal input arriving at input terminal 16, except that the signal reaches output transistor 26 via the collector of grounded base transistor amplifier 12.

It is to be noted that very small voltage excursions take place in the circuit except at the output terminal 30. The voltage excursion at this location is dependent upon the value of load resistance used, amplitude of the input signal and the beta factor of output transistors 26 and 28.

Figure 2:
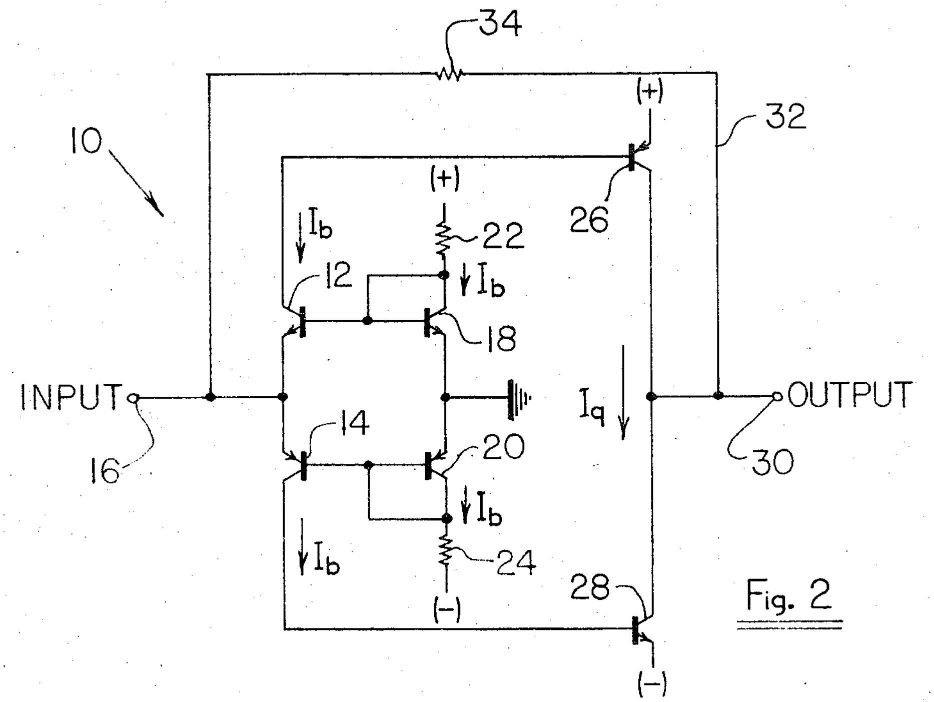

As shown in FIG. 2, which has like reference numerals for like components, the circuit of FIG. 2 is identical to that of FIG. 1 except that a feedback circuit 32 including resistor 34 therein is connected between the collectors of output transistors 26 and 28 and the emitters of input transistors 12 and 14. In this manner, circuit 10 of FIG. 2 can be operated as an operational amplifier with the input current delivered to input terminal 16 and the gain set by feedback resistor 34.

Additional gain may be needed, and if this is the case, additional current amplification stages may be added to the input thereby building the amplitude of signal current up as desired before it is supplied to the common emitters of input transistors 12 and 14.

The approach that this invention takes to the solution of the predictable operation and crossover distortion problems is to treat the transistor as a current amplifier rather than a voltage amplifier and to provide an output circuit that takes advantage of its stable and linear current amplification characteristics.

The amplifier configuration covered by this invention is capable of driving current into a load resistance such that the peak voltage swing is equal to the power supply voltage minus the saturation potential of the output transistor. This type of operation is very important when the power supply potentials available are very small, and the voltage represented by one base to emitter voltage drop is equal to a large percentage of the power supply voltage.

Only very small voltage excursions occur anywhere in the amplifier chain except at the output. This enables a very large gain bandwidth product to be obtained. Moreover, variations in the power supply voltage do not appear in the output. In addition, a minimum number of components are used in this push-pull amplifier thereby rendering it very economical. This amplifier is extremely effective in the low frequency spectrum for advantageous use in the field of Audiology, but it has application to many other various and sundry uses.

Although the invention has been explained with reference to particular embodiments, it is to be appreciated that various adaptations and modifications may be made without departing from the appended claims.

The invention is claimed in accordance with the following:

1. A push-pull amplifier circuit comprising:

input signal means having input terminal means connected thereto for supplying input current signals to said input signal means, said input signal means including means for performing impedance transformation of said input current signals such that the input terminal means appears loaded by a low impedance, said transformation extending to zero frequency or DC;

bias means coupled to said input signal means for generating a quiescent current;

output means provided by said input signal means for supplying said input current signals in a non-inverted condition from a high impedance source of said input signal means, said high impedance source being derived from said impedance transformation means;

output signal inverting means connected to said output means of said input signal means for receiving output signals from said input signal means, said output signal inverting means providing signal gain for amplifying said input current signals to provide amplified output current signals and also receiving said quiescent current from said input signal means for determining the quiescent operating point of said output signal means; and output terminal means connected to said output signal inverting means for receiving said amplified output current signals therefrom.

2. An amplifier circuit according to claim 1 wherein said input signal means comprises complementary transistor means having emitter means thereof connected together and said input terminal means connected to said emitter means.

3. An amplifier circuit according to claim 2 wherein said bias means define other complementary transistor means having base means connected to base means of said first-mentioned complementary transistor means defining idling current set diodes.

4. An amplifier circuit according to claim 3 wherein said first-mentioned complementary transistor means and said other complementary transistor means define current mirrors for quiescent operating point determination.

5. An amplifier circuit according to claim 1 wherein said output signal inverting means comprises complementary transistor means having collector means thereof connected together and said output terminal means connected to said collector means.

6. An amplifier circuit according to claim 1 wherein feedback circuit means is connected between said output terminal means and said input terminal means.

7. A push-pull amplifier comprising:

a first pair of complementary transistors having connection means employed between their emitters;

input terminal means connected to said connection means between said emitters of said first pair of complementary transistors;

a second pair of complementary transistors having their bases connected respectively to the bases of said first pair of complementary transistors for operating said first pair of transistors as grounded base amplifiers and for setting the quiescent current of said first pair of complementary transistors;

a third pair of complementary transistors having connection means between their collectors and connection means between their bases and the respective collectors of said first pair of transistors; and output terminal means connected to said connection means between said collectors of said third pair of complementary transistors.

8. A push-pull amplifier according to claim 7 wherein said second pair of transistors define idling current diodes.

9. A push-pull amplifier according to claim 7 wherein said first pair of complementary transistors and said second pair of complementary transistors define current mirrors for quiescent operating point determination.

10. A push-pull amplifier according to claim 7 wherein feedback circuit means is connected between said output terminal means and said input terminal means.

* * * * *